US012764889B2

(12) United States Patent
Lin et al.

(10) Patent No.: US 12,764,889 B2
(45) Date of Patent: Oct. 13, 2026

(54) QUICK-MOUNT SLIDE RAIL

(71) Applicant: FOSITEK CORPORATION, New Taipei City (TW)

(72) Inventors: Chun-Han Lin, New Taipei City (TW); Che-Wei Chang, New Taipei City (TW); Jia-Wei Pan, New Taipei City (TW)

(73) Assignee: FOSITEK CORPORATION, New Taipei City (TW)

( * ) Notice: Subject to any disclaimer, the term of this patent is extended or adjusted under 35 U.S.C. 154(b) by 189 days.

(21) Appl. No.: 18/776,809

(22) Filed: Jul. 18, 2024

(65) Prior Publication Data

US 2025/0338427 A1 Oct. 30, 2025

(30) Foreign Application Priority Data

Apr. 24, 2024 (TW) ................................ 113115222

(51) Int. Cl.
*H05K 7/14* (2006.01)

(52) U.S. Cl.
CPC ................................ *H05K 7/1489* (2013.01)

(58) Field of Classification Search
None
See application file for complete search history.

(56) References Cited

U.S. PATENT DOCUMENTS

2009/0309471 A1* 12/2009 Yu .......................... A47B 88/43
312/334.44

FOREIGN PATENT DOCUMENTS

CN 203722970 U * 7/2014
CN 209518551 U * 10/2019
JP 3140215 U * 3/2008

OTHER PUBLICATIONS

Chen et. al (JP-3140215-U) (Year: 2007).*
Lin et. al (CN 209518551 U) (Year: 2019).*
Zhuang (CN 203722970 U) (Year: 2013).*

* cited by examiner

*Primary Examiner* — Allen L Parker
*Assistant Examiner* — Elisa Sasserath
(74) *Attorney, Agent, or Firm* — Birch, Stewart, Kolasch & Birch, LLP

(57) ABSTRACT

A quick-mount slide rail is adapted to be disposed on a rack. The quick-mount slide rail includes a bracket and a connector slide module. The bracket includes a side plate and a front plate extending perpendicularly from a front edge of the side plate, and having two through holes. The connector slide module is disposed on the bracket and is movable relative to the side plate among a plurality of locking positions. The connector slide module includes a connector sliding block that has a block body and two stepped cylindrical connectors extending respectively through the through holes. Each stepped cylindrical connector has cylindrical segments. Outer diameters of the cylindrical segments decrease sequentially and forwardly. When the connector slide module is moved to a selected locking position, one of the cylindrical segments of each stepped cylindrical connector protrudes forwardly from the front plate for at least a predetermined distance.

5 Claims, 12 Drawing Sheets

QUICK-MOUNT SLIDE RAIL

CROSS-REFERENCE TO RELATED APPLICATION

This application claims priority to Taiwanese Invention Patent Application No. 113115222, filed on Apr. 24, 2024, the entire disclosure of which is incorporated by reference herein.

FIELD

The disclosure relates to a slide rail, and more particularly to a quick-mount slide rail.

BACKGROUND

A conventional quick-mount slide rail is adapted to be installed on a server rack, and includes a bracket, and two stepped cylindrical connectors disposed on the bracket and adapted to be inserted into two mounting holes of the server rack. Each of the stepped cylindrical connectors has a plurality of cylindrical segments which respectively have outer diameters decreasing sequentially from the back to the front of the stepped cylindrical connectors. These cylindrical segments may be used to appropriately fit into different server racks having mounting holes of different sizes. For each of the stepped cylindrical connectors and a corresponding one of the mounting holes, in a case where the mounting hole has a relatively small size and can only be fitted with the cylindrical segment that has the smallest outer diameter and that is located at a foremost end of the stepped cylindrical connector, a relatively long lever arm of the stepped cylindrical connector with respect to the bracket may be formed, which adversely affects connection strength and stability of assembly therebetween. As a result, such structure of the conventional quick-mount slide rail may be insufficient to support a weight of a server.

SUMMARY

Therefore, an object of the disclosure is to provide a quick-mount slide rail that can alleviate at least one of the drawbacks of the prior art.

According to the disclosure, a quick-mount slide rail is adapted to be disposed on a rack. The rack has a plate body and a plurality of disposition holes formed in the plate body. The quick-mount slide rail includes a bracket and a connector slide module. The bracket includes a side plate and a front plate. The side plate extends in a front-rear direction and an up-down direction perpendicular to the front-rear direction. The front plate extends perpendicularly from a front edge of the side plate in a left-right direction perpendicular to the front-rear direction and the up-down direction, and is adapted to abut against the plate body of the rack. The front plate has two through holes arranged in the up-down direction. The connector slide module is disposed on the bracket, and is movable relative to the side plate along the front-rear direction among a plurality of locking positions. The connector slide module includes a connector sliding block. The connector sliding block has a block body and two stepped cylindrical connectors extending forwardly from the block body and extending respectively through the through holes of the front plate. Each of the stepped cylindrical connectors has a plurality of cylindrical segments. Outer diameters of the cylindrical segments decrease sequentially and forwardly in the front-rear direction. When the connector slide module is moved to a selected one of the locking positions, one of the cylindrical segments of each of the stepped cylindrical connectors protrudes forwardly from the front plate for at least a predetermined distance and is adapted to be inserted into a respective one of the disposition holes of the plate body.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
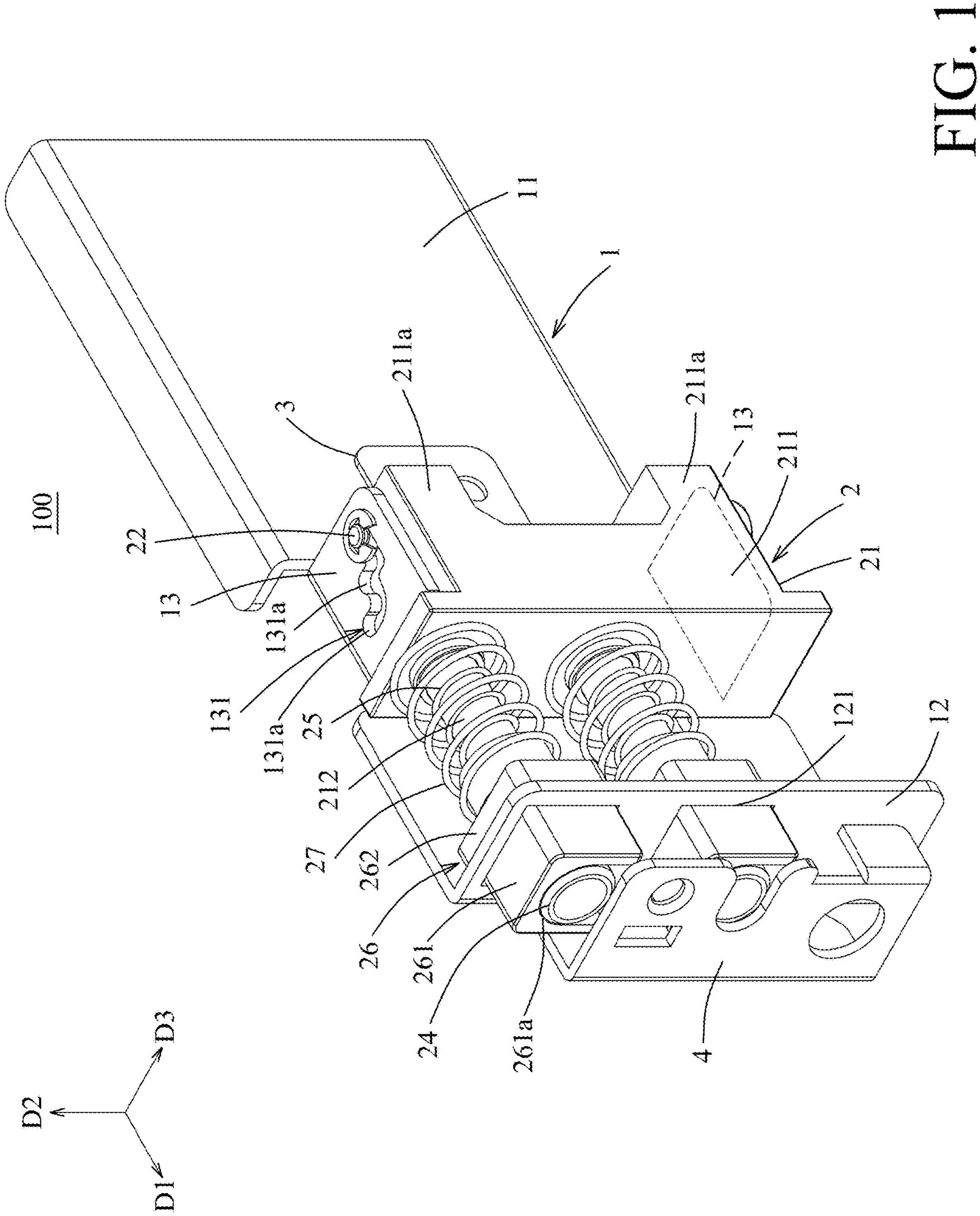
FIG. 1 is a perspective view of an embodiment of a tool-less quick-mount slide rail according to the present disclosure.
Figure 2:
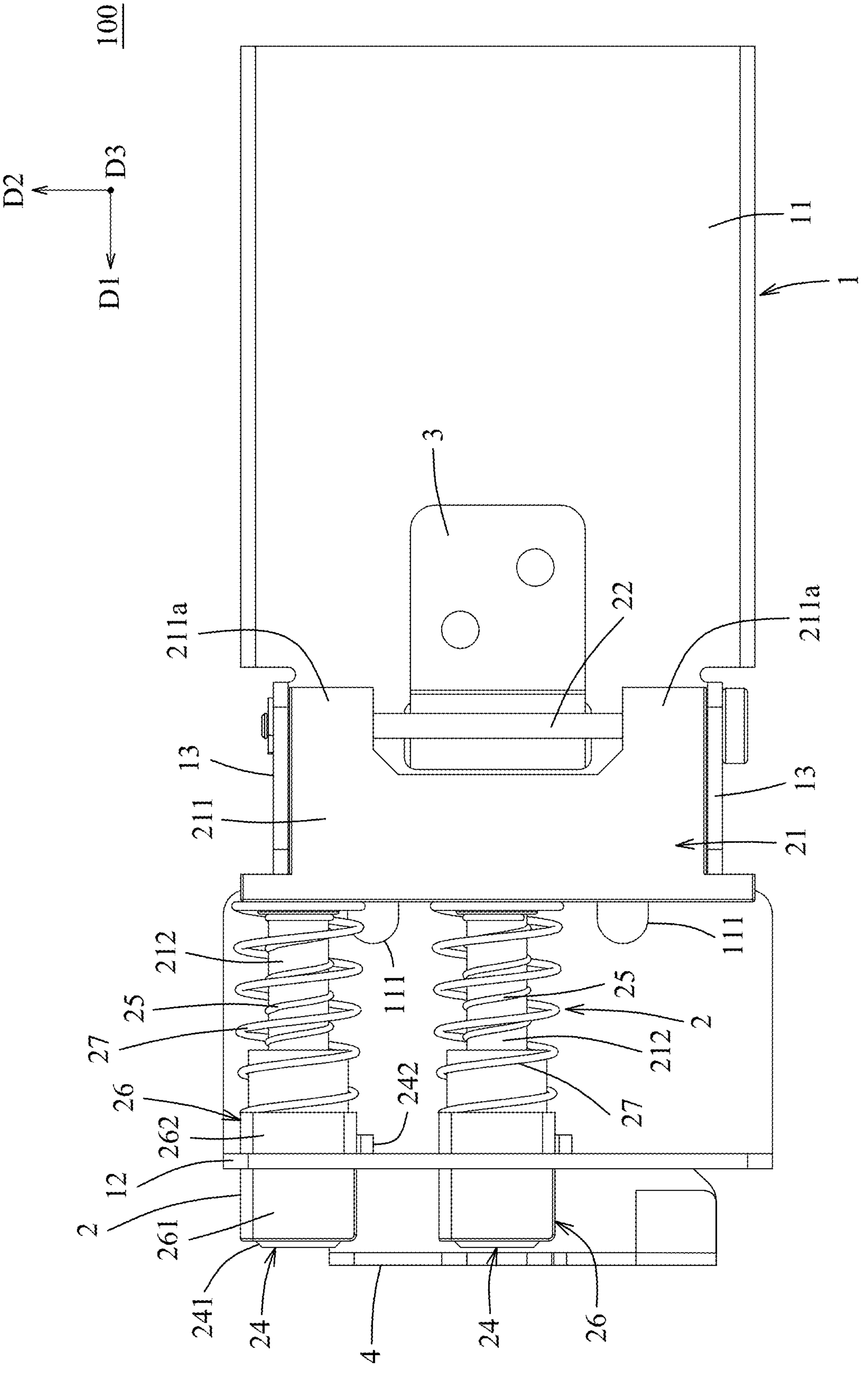
FIG. 2 is a side view of the embodiment.
Figure 3:
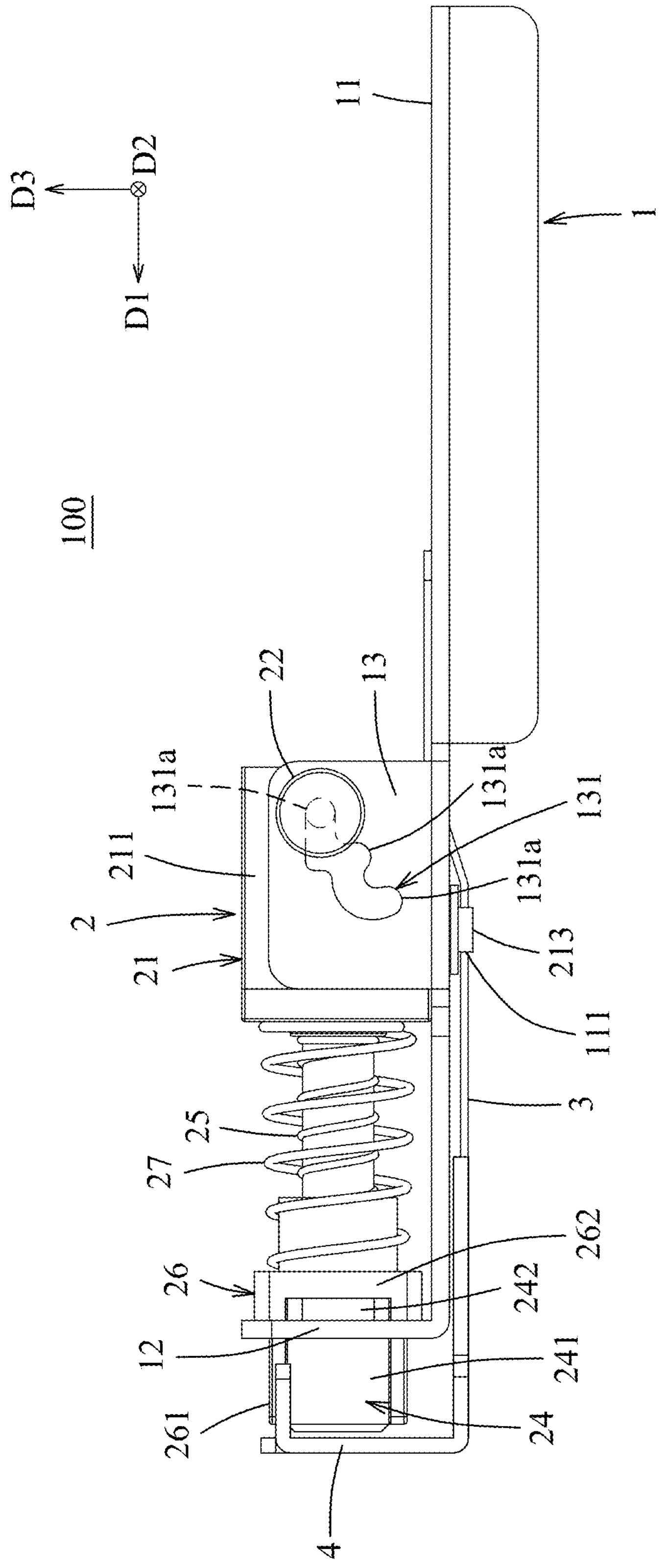
FIG. 3 is a bottom view of the embodiment.
Figure 4:
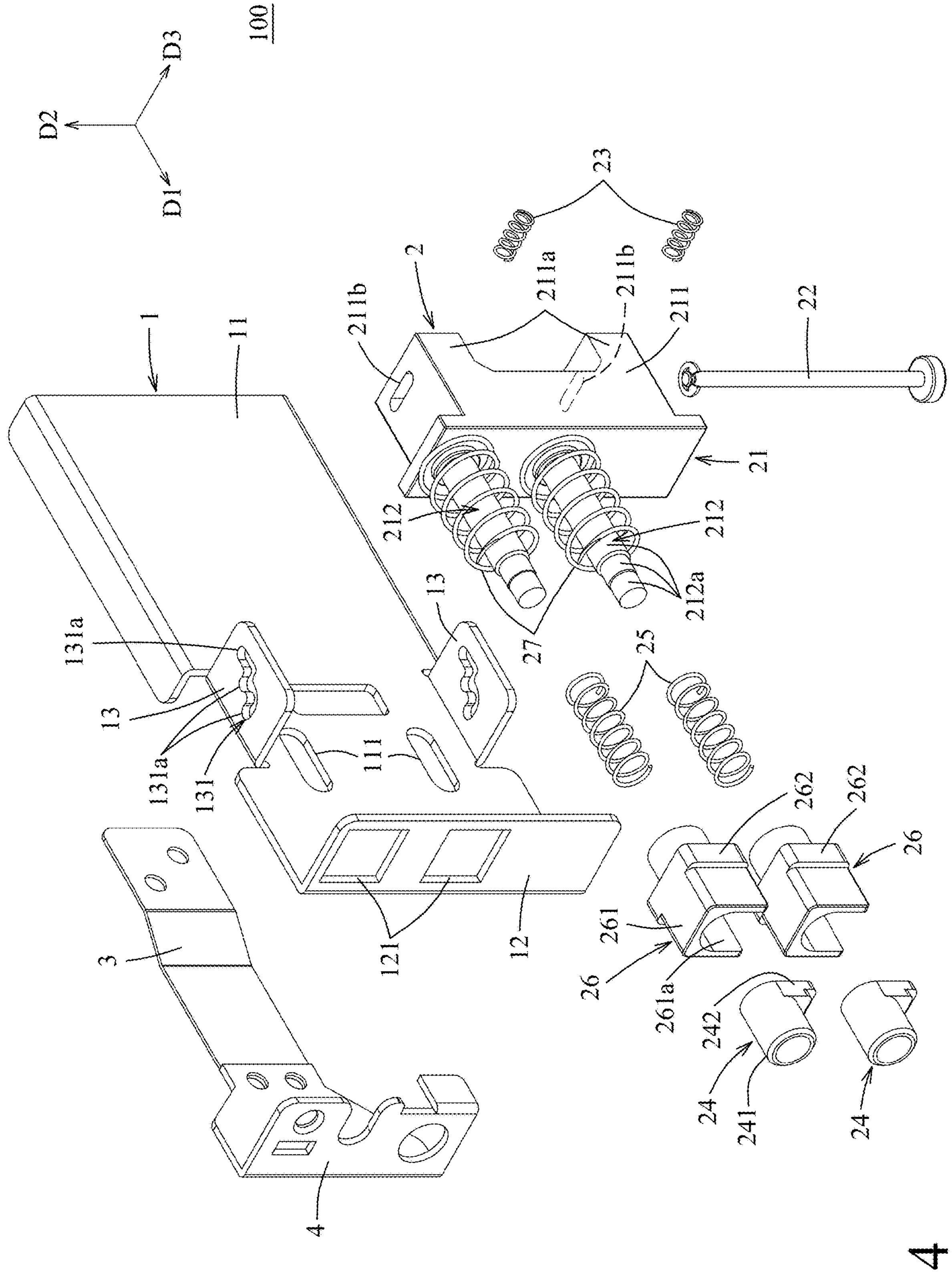
FIG. 4 is a partly exploded perspective view of the embodiment.
Figure 5:
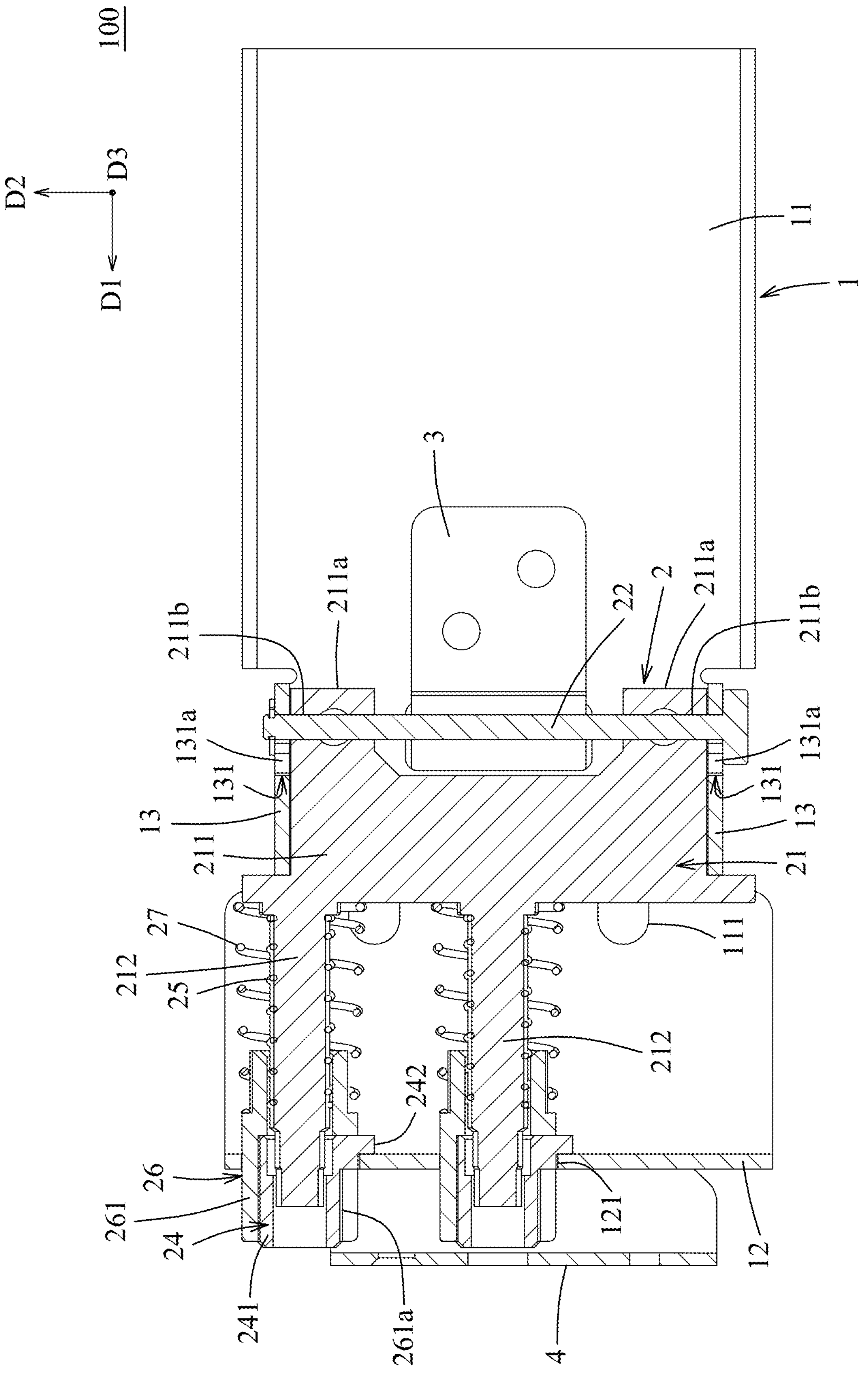
FIG. 5 is a sectional view of the embodiment.
Figure 6:
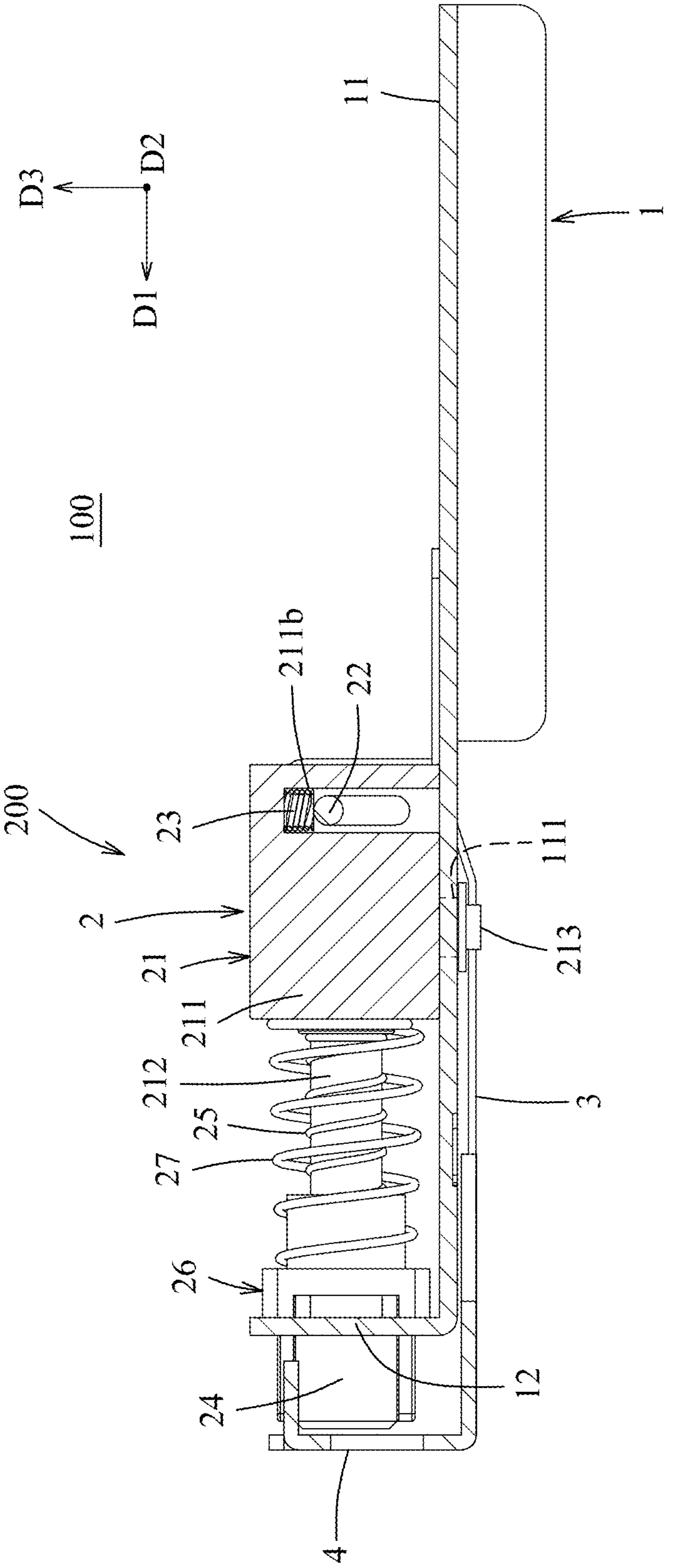
FIG. 6 is another sectional view of the embodiment taken from another angle of view.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as “top,” “bottom,” “upper,” “lower,” “on,” “above,” “over,” “downwardly,” “upwardly” and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 7:
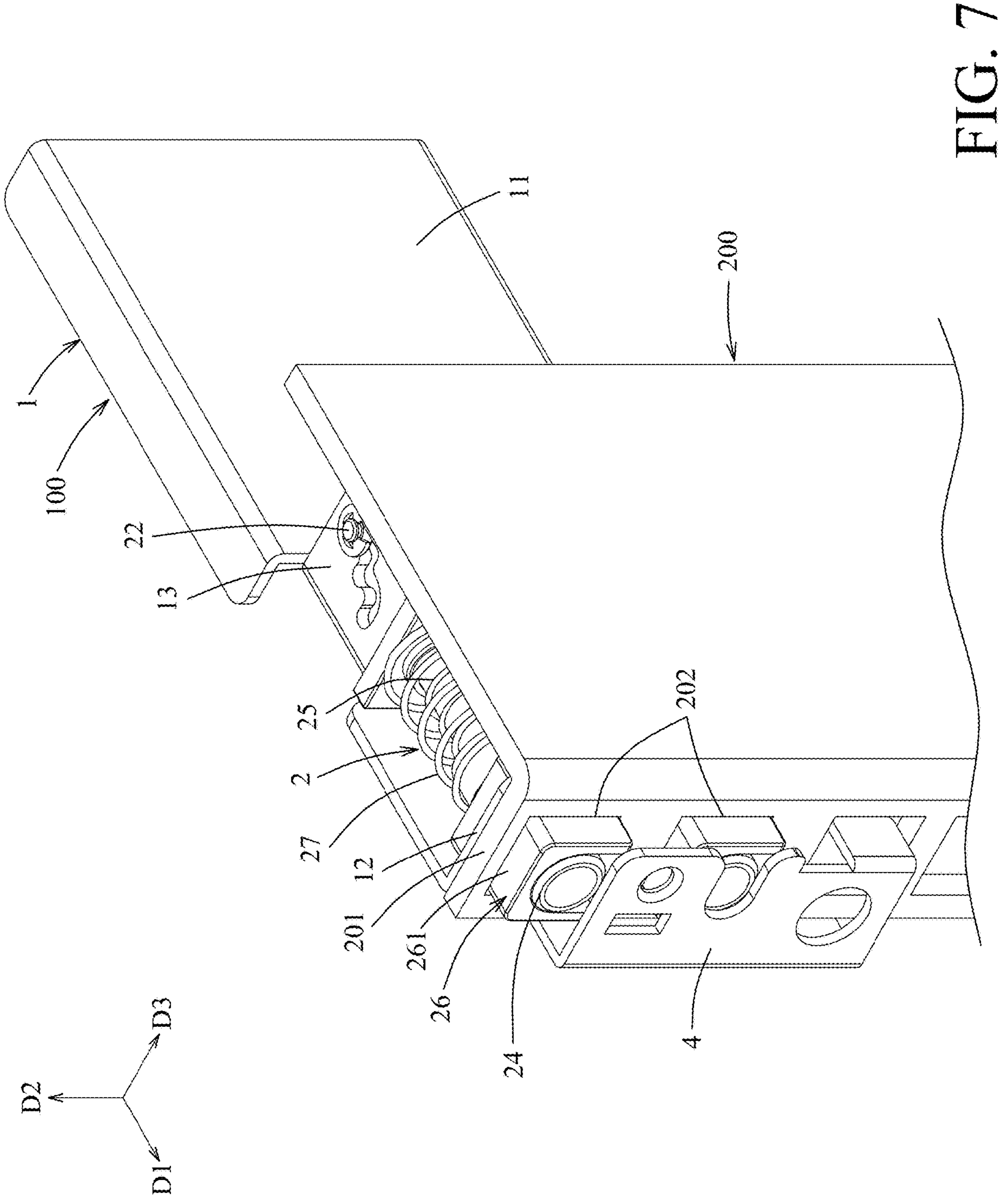
FIG. 7 is a fragmentary perspective view illustrating the embodiment being mounted to a rack.

Referring to FIGS. 1 to 4 and 7, an embodiment of a tool-less quick-mount slide rail 100 of the present disclosure is adapted to be disposed on a rack 200 (see FIG. 7). The rack 200 has a plate body 201 and a plurality of disposition holes 202 formed in the plate body 201. The rack 200 may be, for example, but is not limited to, a server rack. The tool-less quick-mount slide rail 100 includes a bracket 1, a connector slide module 2, a flat spring 3, and an auxiliary connecting member 4. The tool-less quick-mount slide rail 100 is configured to be connected to the rack 200 via a plurality of slide rail members (not shown).

The bracket 1 has a side plate 11 that extends in a front-rear direction (D1) and an up-down direction (D2) perpendicular to the front-rear direction (D1), a front plate 12 that extends perpendicularly from a front edge of the side plate 11 in a left-right direction (D3) perpendicular to the front-rear direction (D1) and the up-down direction (D2), and that is adapted to abut against the plate body 201 of the rack 200, and two positioning plates 13 that extend from the side plate 11 in the left-right direction (D3) and that are opposite to each other in the up-down direction (D2). The side plate 11 of the bracket 1 has two guiding grooves 111 extending in the front-rear direction (D1) and extending through the side plate 11 in the left-right direction (D3). The front plate 12 has two through holes 121 arranged in the up-down direction (D2). Each of the positioning plates 13 has a positioning slot 131 that is wavy in shape. The positioning slot 131 of each of the positioning plates 13 has a plurality of positioning slot portions 131*a*, and a number of the positioning slot portions 131*a* is, e.g., three, but is not limited thereto.

Referring to FIGS. 3 to 6, the connector slide module 2 is disposed on the bracket 1 and is movable relative to the side plate 11 along the front-rear direction (D1) among a plurality of locking positions. A number of the locking positions corresponds to the number of the positioning slot portions 131*a* and is three. The connector slide module 2 includes a connector sliding block 21, a positioning rod 22, two positioning resilient members 23, two sliding sleeve cylindrical connectors 24, two first elastic members 25, two sliding sleeve square connectors 26, and two second elastic members 27.

The connector sliding block 21 has a block body 211, two stepped cylindrical connectors 212 that extend forwardly from the block body 211 and that extend respectively through the through holes 121 of the front plate 12, and two guiding posts 213 (only one is shown in the drawings) that protrude from the block body 211 in the left-right direction (D3), that engage respectively the guiding grooves 111, and that are slidable along the front-rear direction (D1). The block body 211 is located between the positioning plates 13 of the bracket 1. That is to say, the positioning plates 13 are located respectively over and under the block body 211 of the connector sliding block 21. The block body 211 of the connector sliding block 21 has two protrusions 211*a* that are located at the rear end of the block body 211 and that are arranged in the up-down direction (D2), and two sliding slots 211*b* that are respectively formed through the two protrusions 211*a* in the up-down direction (D2) and that extend in the left-right direction (D3). Each of the stepped cylindrical connectors 212 has a plurality of cylindrical segments 212*a* which have outer diameters decreasing sequentially and forwardly in the front-rear direction (D1). In this embodiment, a number of the cylindrical segments 212*a* of each of the stepped cylindrical connectors 212 corresponds to the number of the locking positions and is three. By virtue of cooperation among the guiding grooves 111 and the guiding posts 213, the connector slide module 2 is slidable relative to the side plate 11 along the front-rear direction (D1) among the three locking positions. In some embodiments, the guiding posts 213 may be provided with a gasket and a screw fastened thereon. It should be noted that the numbers of the guiding grooves 111 and the guiding posts 213 may be one or more than three, and are not limited to this embodiment.

The positioning rod 22 extends in the up-down direction (D2) through the sliding slots 211*b*, is slidable along the sliding slots 211*b*, and has two opposite end portions engaging respectively and slidably the positioning slots 131 of the positioning plates 13. The two positioning resilient members 23 are respectively disposed in the sliding slots 211*b*, and are for biasing the positioning rod 22 along the left-right direction (D3) so as to position the positioning rod 22 at a selected one of the positioning slot portions 131*a* of the positioning slot 131 of each of the positioning plates 13.

When the connector slide module 2 is disposed at a selected one of the locking positions, the two positioning resilient members 23 position the positioning rod 22 at one of the positioning slot portions 131*a* of the positioning slot 131 of each of the positioning plates 13. At this time, the positioning rod 22 abuts against the positioning plates 13 to prevent rearward movement of the positioning rod 22. Furthermore, at this time, one of the cylindrical segments 212*a* of each of the stepped cylindrical connectors 212 protrudes forwardly from the front plate 12 for at least a predetermined distance and is adapted to be inserted into a respective one of the disposition holes 202 of the plate body 201. The at least a predetermined distance may be, for example, a thickness of the plate body 201 in the front-rear direction (D1). Since the positioning rod 22 abuts against the positioning plates 13, the connector slide module 2 and the two stepped cylindrical connectors 212 are not allowed to move rearwardly. By adjusting the position of the stepped cylindrical connectors 212 of the connector slide module 2 in the front-rear direction (D1), one of the cylindrical segments 212*a* of each of the stepped cylindrical connectors 212 may protrude forwardly for the at least a predetermined distance from the front plate 12 with the front plate 12 abutting against the plate body 201 of the rack 200, and may be inserted into the respective one of the disposition holes 202 of the plate body 201. As such, the tool-less quick-mount slide rail 100 would not form a relatively long lever arm with respect to the rack 200, which may otherwise adversely affect connection strength between the tool-less quick-mount slide rail 100 and the rack 200, and thus stability of assembly between the rack 200 and the tool-less quick-mount slide rail 100 may be ensured.

The two sliding sleeve cylindrical connectors 24 are respectively and slidably sleeved on the two stepped cylindrical connectors 212. The two first elastic members 25 are sleeved respectively on the two stepped cylindrical connectors 212 and each of the two first elastic members 25 is clamped between the respective one of the two stepped cylindrical connectors 212 and the block body 211 of the connector sliding block 21. Each of the sliding sleeve cylindrical connectors 24 has a substantially cylindrical profile, and includes a cylindrical post connector portion 241, and a first abutment portion 242 that is located rearwardly of the cylindrical post connector portion 241. The two first elastic members 25 are disposed for respectively biasing the two sliding sleeve cylindrical connectors 24 forwardly so as to abut the first abutment portions 242 of the two sliding sleeve cylindrical connectors 24 against a rear side of the front plate 12, and for protruding the cylindrical post connector portions 241 of the two sliding sleeve cylindrical connectors 24 forwardly and outwardly of the two through holes 121, respectively, for the at least a predetermined distance.

The two sliding sleeve square connectors 26 are respectively and slidably sleeved on the two stepped cylindrical connectors 212. The two second elastic members 27 are sleeved respectively on the two stepped cylindrical connectors 212 and each of the two second elastic members 27 is clamped between a respective one of the two sliding sleeve square connectors 26 and the block body 211 of the connector sliding block 21. An outer diameter of each of the two second elastic members 27 is larger than that of each of the two first elastic members 25 to prevent interference therewith. Each of the sliding sleeve square connectors 26 has a substantially cylindrical profile, and includes a square post connector portion 261, and a second abutment portion 262 that is located rearwardly of the square post connector portion 261. The two second elastic members 27 are disposed for respectively biasing the two sliding sleeve square connectors 26 forwardly to abut the second abutment portions 262 of the two sliding sleeve square connectors 26 against the rear side of the front plate 12, and for protruding the square post connector portions 261 of the two sliding sleeve square connectors 26 forwardly and outwardly of the two through holes 121, respectively, for the at least a predetermined distance. Specifically, a width of the square post connector portion 261 of each of the two sliding sleeve square connectors 26 in the left-right direction (D3) is larger than that of the cylindrical post connector portion 241 of each of the two sliding sleeve cylindrical connectors 24 in the left-right direction (D3). The square post connector portion 261 of each of the sliding sleeve square connectors 26 is formed with an accommodation groove 261*a* for accommodating the cylindrical post connector portion 241 of a respective one of the sliding sleeve cylindrical connectors 24. The rack 200 may come in various types (for example, different types of racks 200 have the disposition holes 202 various in size), and by virtue of the two sliding sleeve cylindrical connectors 24 and the two sliding sleeve square connectors 26, the tool-less quick-mount slide rail 100 may be mounted to various types of racks 200.

The auxiliary connecting member 4 is mounted to the side plate 11 of the bracket 1 through the flat spring 3, and is for engaging the rack 200 to provide an auxiliary fixing effect for connecting the side plate 11 to the rack 200.

Some assembly scenarios of the tool-less quick-mount slide rail 100 being mounted to various types of racks 200 are described below.

Figure 8:
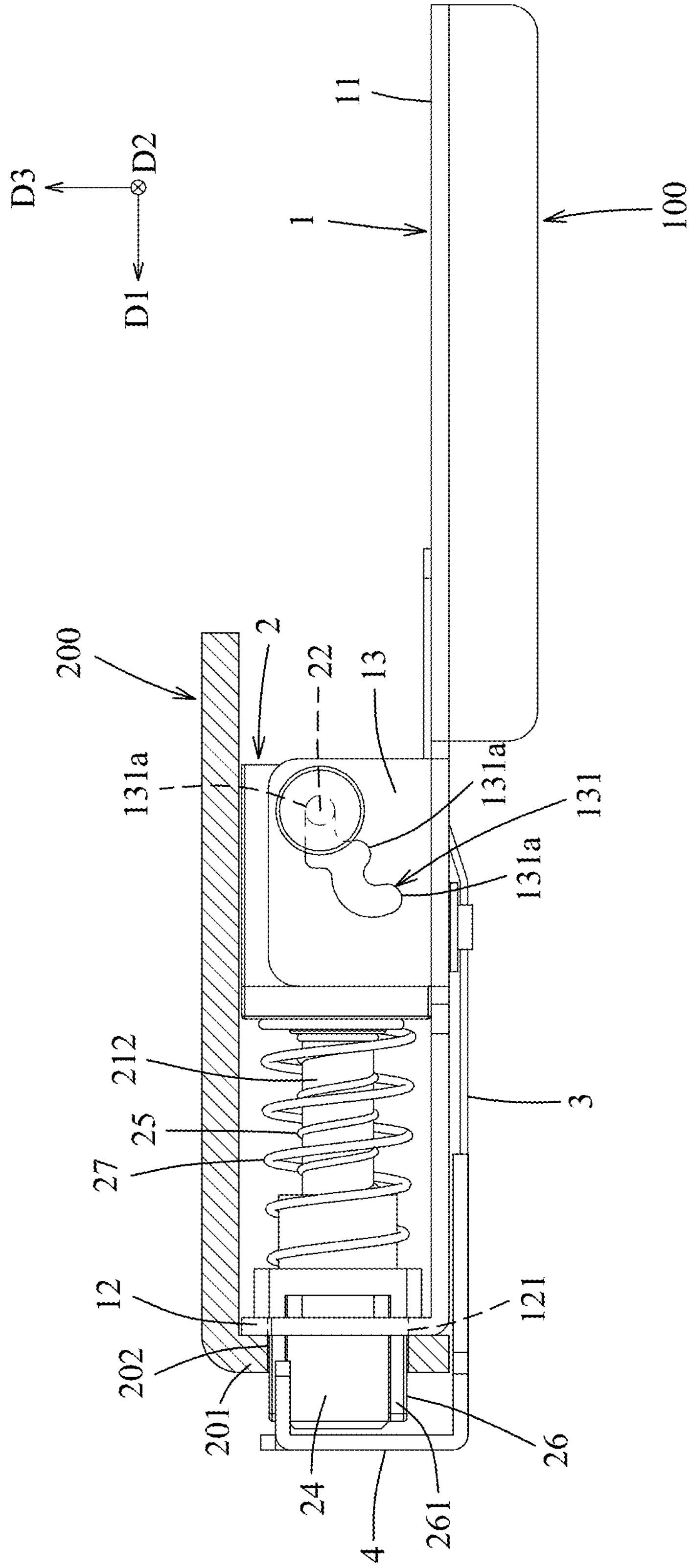
FIGS. 8 to 12 are bottom views of the embodiment with the rack being sectioned, illustrating the embodiment being mounted to various types of racks that have different sized disposition holes.

Referring to FIGS. 7 and 8, when the tool-less quick-mount slide rail 100 is mounted to the rack 200 with each of the disposition holes 202 being a square hole that has a relatively large length, e.g., 9.5 mm, the front plate 12 of the bracket 1 abuts forwardly against the plate body 201 of the rack 200 and the square post connector portion 261 of each of the sliding sleeve square connectors 26 protrudes forwardly and outwardly of the respective one of the through holes 121 for the at least a predetermined distance, so as to be inserted into the respective one of the disposition holes 202 of the plate body 201.

Figure 9:
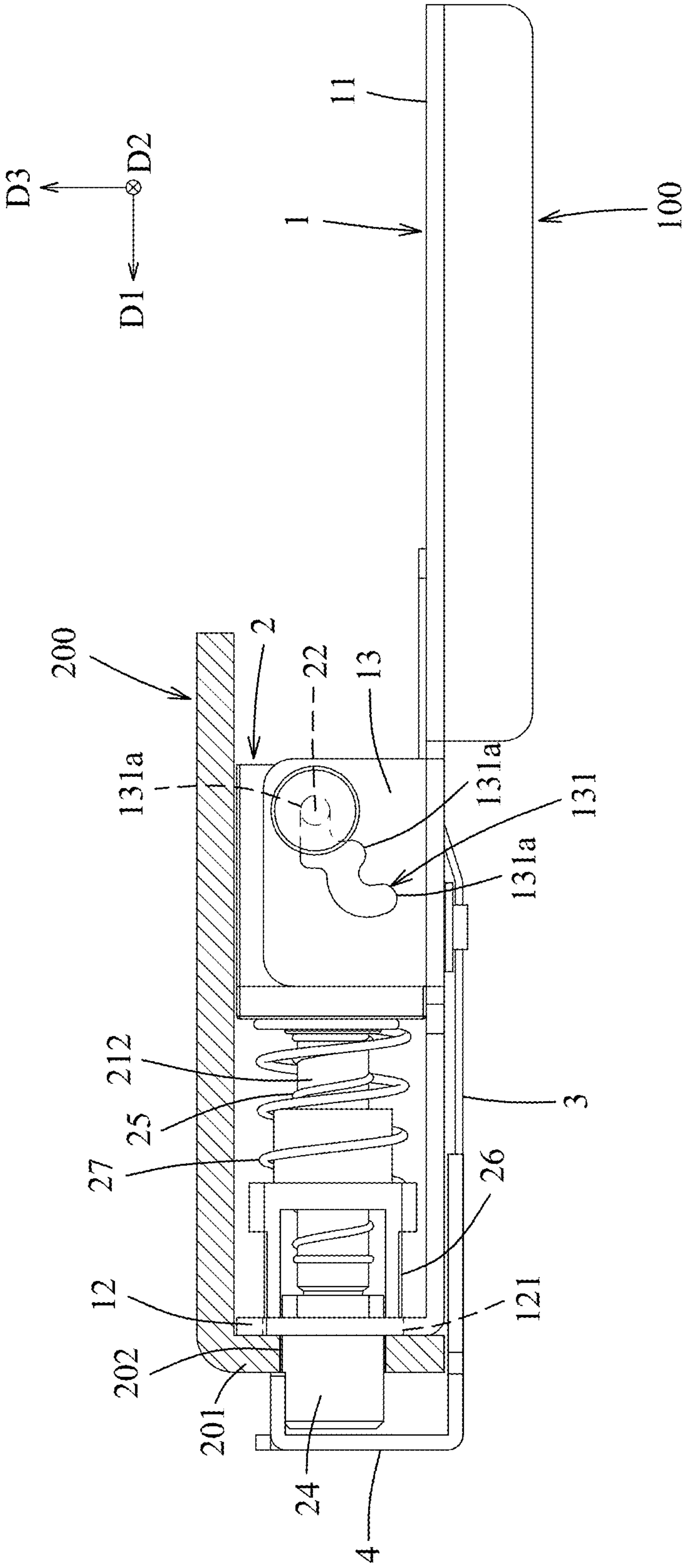

Referring to FIG. 9, when the tool-less quick-mount slide rail 100 is mounted to the rack 200 with each of the disposition holes 202 being a circular hole that has a relatively large diameter, e.g., 7.1 mm, the front plate 12 of the bracket 1 abuts against the plate body 201 of the rack 200 and each of the sliding sleeve square connectors 26 is blocked by and disposed rearwardly of the plate body 201. That is to say, each of the sliding sleeve square connectors 26 slides rearwardly on the respective one of the stepped cylindrical connectors 212 as compared to FIG. 8. Thus, each of the sliding sleeve cylindrical connectors 24 protrudes forwardly for the at least a predetermined distance from the respective one of the through holes 121 so as to be inserted into the respective one of the disposition holes 202 of the plate body 201.

Figure 10:
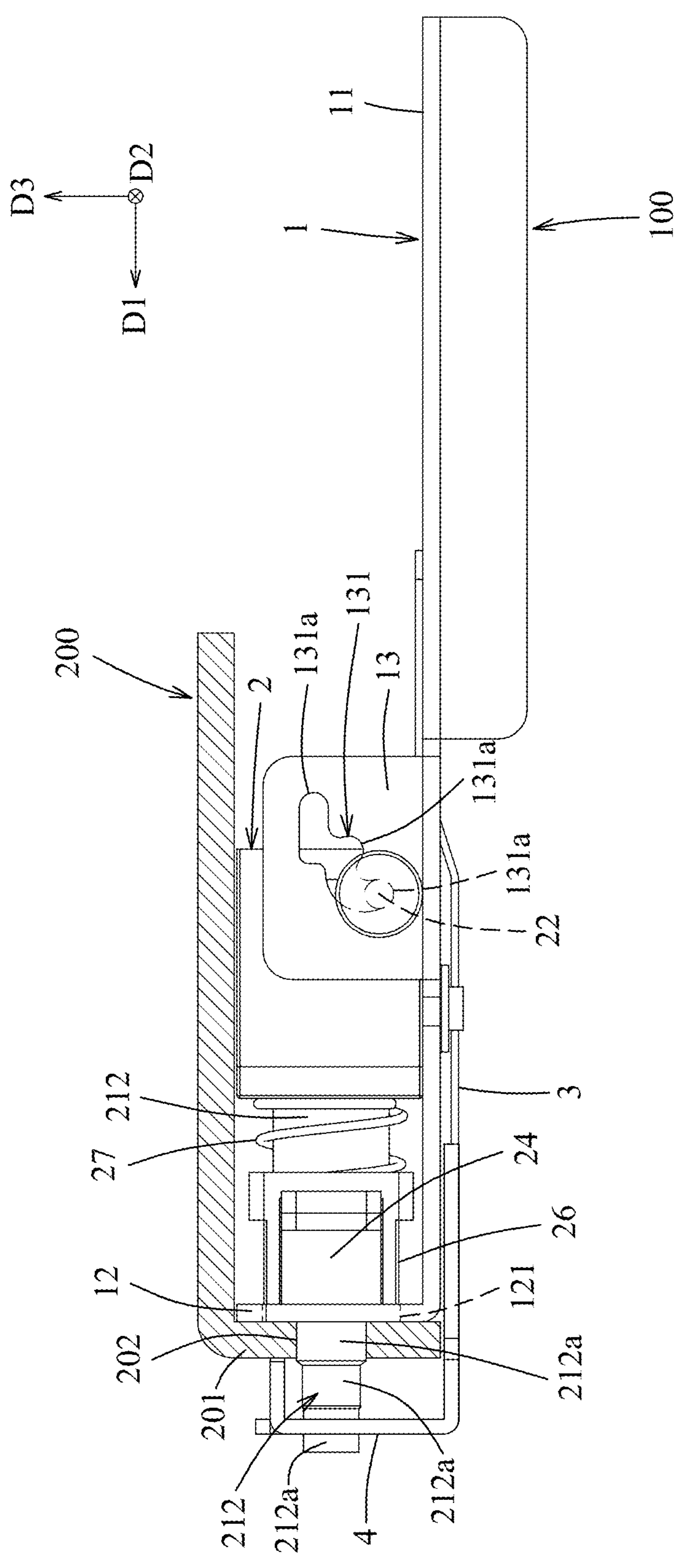

Referring to FIG. 10, when the tool-less quick-mount slide rail 100 is mounted to the rack 200 with each of the disposition holes 202 being a circular hole that has a smaller diameter, e.g., 4.8 mm, the front plate 12 of the bracket 1 abuts against the plate body 201 of the rack 200, and each of the sliding sleeve square connectors 26 and each of the sliding sleeve cylindrical connectors 24 are blocked by and disposed rearwardly of the plate body 201. That is to say, as compared to FIG. 9, each of the sliding sleeve square connectors 26 and each of the sliding sleeve cylindrical connectors 24 slide rearwardly on the respective one of the stepped cylindrical connectors 212 as a result of operating and moving the opposite end portions of the positioning rod 22 respectively in the positioning slots 131. In this way, the connector slide module 2 is adjusted to a foremost one of the locking positions in the front-rear direction (D1), such that a rearmost one of the cylindrical segments 212*a*, which has the largest outer diameter, of each of the stepped cylindrical connectors 212 protrudes forwardly for the at least a predetermined distance from the respective one of the through holes 121 so as to be inserted into the respective one of the disposition holes 202 of the plate body 201.

Figure 11:
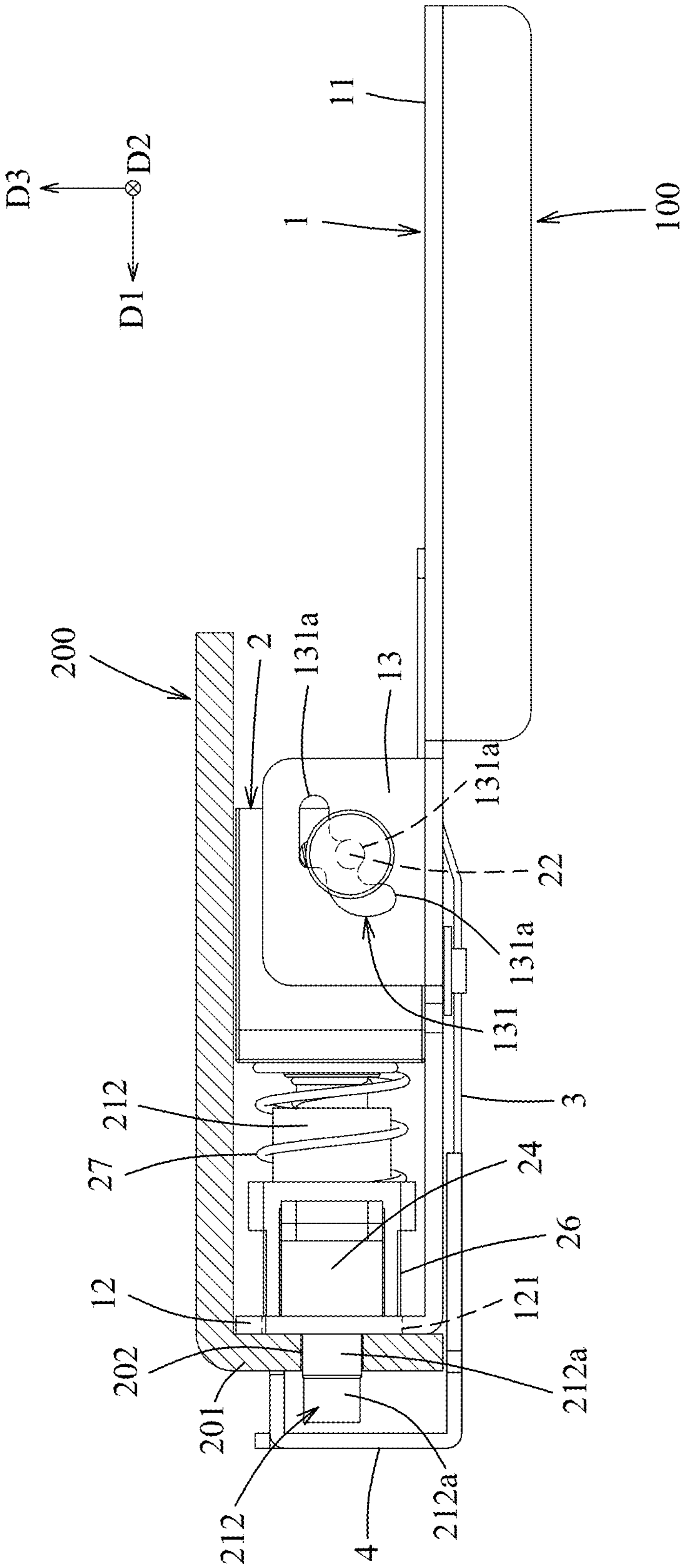

Referring to FIG. 11, when the tool-less quick-mount slide rail 100 is mounted to the rack 200 with each of the disposition holes 202 being a circular hole that has an even smaller diameter, e.g., 4.2 mm or 4.0 mm, the front plate 12 of the bracket 1 abuts against the plate body 201 of the rack 200, and each of the sliding sleeve square connectors 26 and each of the sliding sleeve cylindrical connectors 24 are blocked by and disposed rearwardly of the plate body 201. That is to say, as compared to FIG. 10, each of the sliding sleeve square connectors 26 and each of the sliding sleeve cylindrical connectors 24 slide rearwardly on the respective one of the stepped cylindrical connectors 212 as a result of operating and moving the opposite end portions of the positioning rod 22 respectively in the positioning slots 131. In this way, the connector slide module 2 is adjusted to a middle one of the locking positions in the front-rear direction (D1), such that a middle one of the cylindrical segments 212*a*, which has a middle outer diameter, of each of the stepped cylindrical connectors 212 protrudes forwardly for the at least a predetermined distance from the respective one of the through holes 121 so as to be inserted into the respective one of the disposition holes 202 of the plate body 201.

Figure 12:
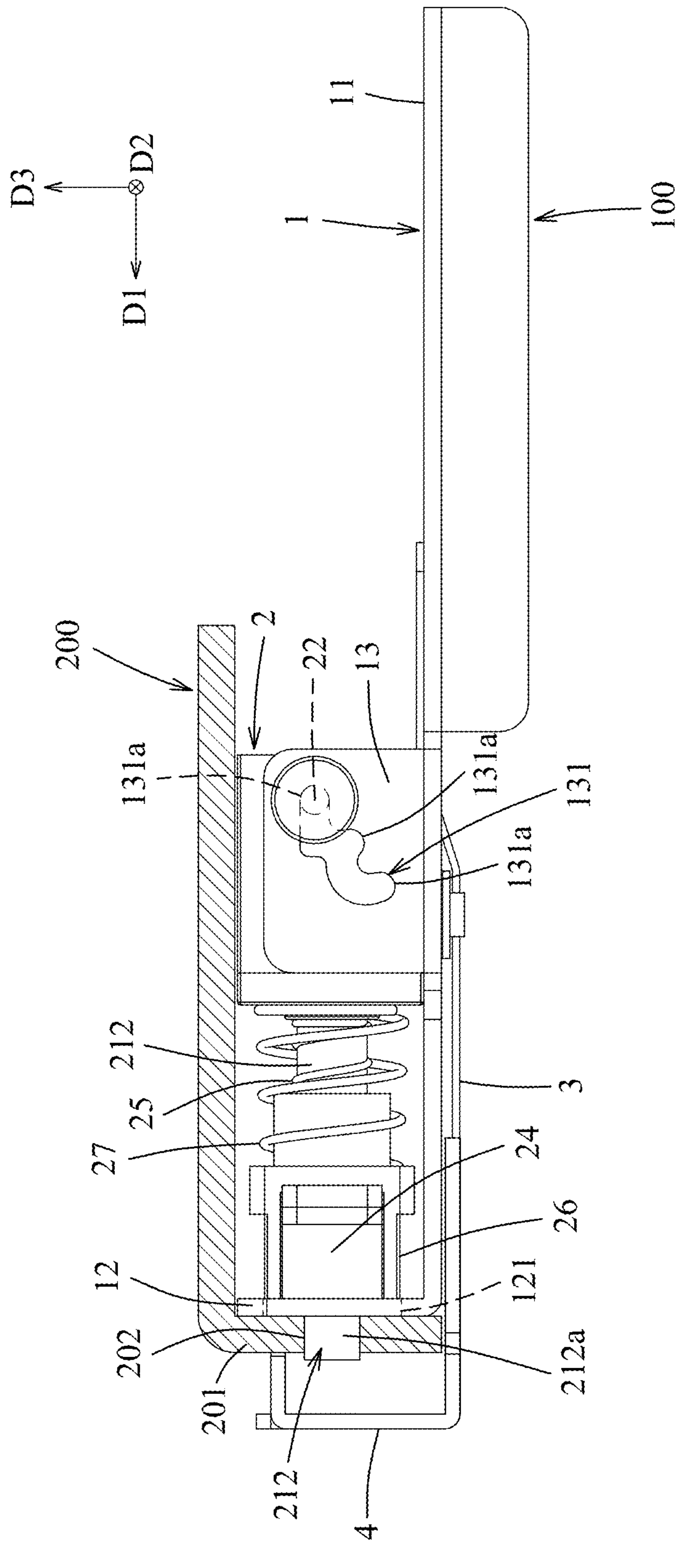

Referring to FIG. 12, when the tool-less quick-mount slide rail 100 is mounted to the rack 200 with each of the disposition holes 202 being a circular hole that has a smallest diameter, e.g., 3.8 mm, the front plate 12 of the bracket 1 abuts against the plate body 201 of the rack 200, and each of the sliding sleeve square connectors 26 and each of the sliding sleeve cylindrical connectors 24 are blocked by and disposed rearwardly of the plate body 201. That is to say, as compared to FIG. 10, each of the sliding sleeve square connectors 26 and each of the sliding sleeve cylindrical connectors 24 slide rearwardly on the respective one of the stepped cylindrical connectors 212 as a result of operating and moving the opposite end portions of the positioning rod 22 respectively in the positioning slots 131. In this way, the connector slide module 2 is adjusted to a rearmost one of the locking positions in the front-rear direction (D1), such that a foremost one of the cylindrical segments 212*a*, which has the smallest outer diameter, of each of the stepped cylindrical connectors 212 protrudes forwardly for the at least a predetermined distance from the respective one of the through holes 121 so as to be inserted into the respective one of the disposition holes 202 of the plate body 201.

In summary, by virtue of the configuration of the connector slide module 2 of the present disclosure that is movable relative to the side plate 11 among a plurality of locking positions in the front-rear direction (D1), positions of the two stepped cylindrical connectors 212 of the connector slide module 2 relative to the rack 200 in the front-rear direction (D1) are thus adjusted. In this way, at least one of the cylindrical segments 212*a* of each of the stepped cylindrical connectors 212 may protrude forwardly for the at least a predetermined distance from the front plate 12 of the bracket 1 that abuts against the plate body 201 of the rack 200 so as to be inserted into the respective one of the disposition holes 202 of the plate body 201. As such, the tool-less quick-mount slide rail 100 would not form a lever arm that is too long with respect to the rack 200, and the stability of assembly between the rack 200 and the tool-less quick-mount slide rail 100 may be relatively good.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A quick-mount slide rail adapted to be disposed on a rack, the rack having a plate body and a plurality of disposition holes that are formed in the plate body, said quick-mount slide rail comprising:

a bracket including a side plate that extends in a front-rear direction and an up-down direction perpendicular to the front-rear direction, and a front plate that extends perpendicularly from a front edge of said side plate in a left-right direction perpendicular to the front-rear direction and the up-down direction, and that is adapted to abut against the plate body of the rack, said front plate having two through holes that are arranged in the up-down direction; and a connector slide module disposed on said bracket, and movable relative to said side plate along the front-rear direction among a plurality of locking positions, said connector slide module including a connector sliding block that has a block body, and two stepped cylindrical connectors extending forwardly from said block body and extending respectively through said through holes of said front plate, each of said stepped cylindrical connectors having a plurality of cylindrical segments, outer diameters of said cylindrical segments decreasing sequentially and forwardly in the front-rear direction;

wherein, when said connector slide module is moved to a selected one of the locking positions, one of said cylindrical segments of each of said stepped cylindrical connectors protrudes forwardly from said front plate for at least a predetermined distance and is adapted to be inserted into a respective one of the disposition holes of the plate body;

wherein said bracket further includes two positioning plates extending from said side plate in the left-right direction, and located respectively over and under said block body of said connector sliding block, each of said positioning plates has a positioning slot wavy in shape, said positioning slot of each of said positioning plates has a plurality of positioning slot portions, said block body of said connector sliding block has at least one sliding slot formed through said block body in the up-down direction and extending in the left-right direction, said connector slide module further includes a positioning rod extending in the up-down direction through said at least one sliding slot and slidable along said at least one sliding slot, said positioning rod having opposite end portions that engage respectively and slidably said positioning slots of said positioning plates, and when said connector slide module is disposed at the selected one of the locking positions, said positioning rod is disposed at one of said positioning slot portions of said positioning slot of each of said positioning plates, and abuts against said positioning plates to prevent rearward movement of said positioning rod; and wherein said connector slide module further includes at least one positioning resilient member disposed in said at least one sliding slot for biasing said positioning rod, so as to position said positioning rod at a selected one of said positioning slot portions of said positioning slot of each of said positioning plates.

2. The quick-mount slide rail as claimed in claim 1, wherein said side plate of said bracket has at least one guiding groove extending in the front-rear direction, and said connector sliding block further has at least one guiding post protruding from said block body, engaging said at least one guiding groove, and slidable along the front-rear direction.

3. The quick-mount slide rail as claimed in claim 1, wherein:

said connector slide module further includes two sliding sleeve cylindrical connectors respectively and slidably sleeved on said two stepped cylindrical connectors and each having a substantially cylindrical profile, and two first elastic members, each being clamped between a respective one of said two sliding sleeve cylindrical connectors and said block body of said connector sliding block;

each of said sliding sleeve cylindrical connectors includes a cylindrical post connector portion, and a first abutment portion located rearwardly of said cylindrical post connector portion; and said two first elastic members are disposed for respectively biasing said two sliding sleeve cylindrical connectors forwardly so as to abut said first abutment portions of said two sliding sleeve cylindrical connectors against a rear side of said front plate, and for protruding said cylindrical post connector portions of said sliding sleeve cylindrical connectors forwardly and outwardly of said two through holes, respectively, for said at least predetermined distance.

4. The quick-mount slide rail as claimed in claim 3, wherein:

said connector slide module further includes two sliding sleeve square connectors respectively and slidably sleeved on said two stepped cylindrical connectors and each having a substantially rectangular profile, and two second elastic members, each being clamped between a respective one of said two sliding sleeve square connectors and said block body of said connector sliding block;

each of said sliding sleeve square connectors includes a square post connector portion for accommodating said cylindrical post connector portion of a respective one of said sliding sleeve cylindrical connectors, and a second abutment portion located rearwardly of said square post connector portion; and said two second elastic members are disposed for respectively biasing said two sliding sleeve square connectors forwardly so as to abut said second abutment portions of said two sliding sleeve square connectors against a rear side of said front plate, and for protruding said square post connector portions of said sliding sleeve square connectors forwardly and outwardly of said through holes, respectively, for said at least predetermined distance.

5. The quick-mount slide rail as claimed in claim 1, wherein:

said connector slide module further includes two sliding sleeve square connectors respectively and slidably sleeved on said two stepped cylindrical connectors and each having a substantially rectangular profile, and two second elastic members, each being clamped between a respective one of said two sliding sleeve square connectors and said block body of said connector sliding block;

each of said sliding sleeve square connectors includes a square post connector portion, and a second abutment portion located rearwardly of said square post connector portion; and said two second elastic members are disposed for respectively biasing said two sliding sleeve square connectors forwardly to abut said second abutment portions of said two sliding sleeve square connectors against a rear side of said front plate, and for protruding said square post connector portions of said sliding sleeve square connectors forwardly and outwardly of said through holes, respectively, for said at least predetermined distance.

* * * * *